United States Patent
Masuda (12) United States Patent (10) Patent No.: US 10,394,683 B2
(45) Date of Patent: Aug. 27, 2019

(54) DATA TRANSMISSION METHOD, NON-TRANSITORY STORAGE MEDIUM, DATA TRANSMISSION DEVICE, LITHOGRAPHY APPARATUS, AND METHOD OF MANUFACTURING PRODUCT

(71) Applicant: CANON KABUSHIKI KAISHA, Tokyo (JP)

(72) Inventor: Mitsuhiro Masuda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 209 days.

(21) Appl. No.: 15/482,527

(22) Filed: Apr. 7, 2017

(65) Prior Publication Data

US 2017/0300399 A1 Oct. 19, 2017

(30) Foreign Application Priority Data

Apr. 15, 2016 (JP) .................................. 2016-082317

(51) Int. Cl.
*G06F 11/34* (2006.01)
*G06F 11/28* (2006.01)
(Continued)

(52) U.S. Cl.
CPC ...... *G06F 11/3476* (2013.01); *G03F 7/70491* (2013.01); *G03F 7/70508* (2013.01);
(Continued)

(58) Field of Classification Search
CPC ...... H04L 1/00; H04L 1/0003; G06F 11/3476; G06F 11/3041; G03F 7/70525; G03F 7/70491
(Continued)

(56) References Cited

U.S. PATENT DOCUMENTS

2005/0100831 A1* 5/2005 Finders ............... G03F 7/70333
430/322
2010/0070935 A1 3/2010 Bist
(Continued)

FOREIGN PATENT DOCUMENTS

JP 2015-79817 A 4/2015
TW I351731 B 11/2011

*Primary Examiner* — Kwang B Yao
*Assistant Examiner* — Syed M Bokhari
(74) *Attorney, Agent, or Firm* — Canon U.S.A., Inc. IP Division (57) ABSTRACT

A data transmission method of transmitting data of log information recorded in log data of a manufacturing apparatus to an external device includes: storing correspondence information between information of a first identifier and information of a second identifier, the first identifier being an identifier used to identify a thing about a process performed by the manufacturing apparatus and being shared by the manufacturing apparatus and the external device, the second identifier being an identifier used to identify a thing about a process performed by the manufacturing apparatus and being used by the manufacturing apparatus; and obtaining, based on the correspondence information, information of the first identifier corresponding to information of the second identifier recorded in log information, and transmitting data of the log information to which the obtained information of the first identifier has been added. The storing and the obtaining are executed by an information processing device.

17 Claims, 8 Drawing Sheets

(51) Int. Cl.
*G06F 11/30* (2006.01)
*H01L 21/027* (2006.01)
*G03F 7/20* (2006.01)

(52) U.S. Cl.
CPC .......... *G03F 7/70525* (2013.01); *G06F 11/28* (2013.01); *G06F 11/3041* (2013.01); *G06F 11/3072* (2013.01); *G06F 11/3086* (2013.01); *G06F 11/3409* (2013.01); *H01L 21/027* (2013.01)

(58) Field of Classification Search
USPC .......................................................... 370/379
See application file for complete search history.

(56) References Cited

U.S. PATENT DOCUMENTS

| | | | |
|---|---|---|---|
| 2014/0040698 A1 | 2/2014 | Loh | |
| 2015/0087423 A1* | 3/2015 | Fujii | G07F 17/3255 463/42 |
| 2015/0268560 A1* | 9/2015 | Tada | G03F 7/70991 355/67 |
| 2015/0364298 A1* | 12/2015 | Kotoku | H01J 37/3023 250/492.22 |

* cited by examiner

FIG. 5A 2016-01-01 00:00:10 (jobNo = 1, waferNo = -1)  Create Job JobID: TEST_LOT

FIG. 5B 1 2016-01-01 00:00:10 (jobNo = 1, waferNo = -1)  Create Job JobID: TEST_LOT

FIG. 5C

| jobNo | JobID    | waferNo | WaferID |
|-------|----------|---------|---------|
| 1     | TEST_LOT |         |         |
|       |          |         |         |
|       |          |         |         |

FIG. 5D 2016-01-01 00:00:20 (jobNo = 1, waferNo = 1) WaferIN WaferID: TEST_LOT_W1

FIG. 5E 1 2016-01-01 00:00:10 (jobNo = 1, waferNo = -1)  Create Job JobID: TEST_LOT
2 2016-01-01 00:00:20 (jobNo = 1, waferNo = 1) WaferIN WaferID: TEST_LOT_W1

FIG. 5F

| jobNo | JobID    | waferNo | WaferID      |
|-------|----------|---------|--------------|
| 1     | TEST_LOT | 1       | TEST_LOT_W1  |
|       |          |         |              |
|       |          |         |              |

FIG. 5G 2016-01-01 00:00:30 (jobNo = 1, waferNo = 1) Exposure Target Dose: 100

2016-01-01 00:00:31 (jobNo = 1, waferNo = 1) Exposure Real Dose: 101

2016-01-01 00:00:32 (jobNo = 1, waferNo = 1) Exposure End

FIG. 5H 1 2016-01-01 00:00:30 (jobNo = 1, waferNo = 1) Exposure Target Dose: 100
2 2016-01-01 00:00:31 (jobNo = 1, waferNo = 1) Exposure Real Dose: 101
3 2016-01-01 00:00:32 (jobNo = 1, waferNo = 1) Exposure End

FIG. 5I

JobID: TEST_LOT
WaferID: TEST_LOT_W1

FIG. 5J

EventTime: 2016-01-01 00:00:32
JobID: TEST_LOT
WaferID: TEST_LOT_W1
Exposure Target Dose: 100
Exposure Real Dose: 101
Exposure End

FIG. 7A

| jobNo | EventTime | JobID |
|---|---|---|
| 1 | 2016-01-01 00:00:10 | LOT_0001 |
| ...... | ...... | ...... |
| 1000 | 2016-02-01 00:00:10 | LOT_1000 |

| waferNo | EventTime | WaferID |
|---|---|---|
| 1 | 2016-01-01 00:00:20 | LOT_0001_W1 |
| ...... | ...... | ...... |
| 1 | 2016-02-01 00:00:20 | LOT_1000_W1 |

FIG. 7B 2016-02-01 00:00:30 (jobNo = 1000, waferNo = 1) Exposure Target Dose: 100

2016-02-01 00:00:31 (jobNo = 1000, waferNo = 1) Exposure Real Dose: 101

2016-02-01 00:00:32 (jobNo = 1000, waferNo = 1) Exposure End

DATA TRANSMISSION METHOD, NON-TRANSITORY STORAGE MEDIUM, DATA TRANSMISSION DEVICE, LITHOGRAPHY APPARATUS, AND METHOD OF MANUFACTURING PRODUCT

BACKGROUND OF THE INVENTION

Field of the Invention

An aspect of the embodiments relates to a data transmission method, a non-transitory storage medium, a data transmission device, a lithography apparatus, and a method of manufacturing a product.

Description of the Related Art

In a manufacturing apparatus that manufactures products, such as devices, a program for controlling the manufacturing apparatus collects pieces of log information in which histories about the operation or control of various devices constituting the manufacturing apparatus are recorded, for example, and then stores, as log data, the pieces of log information in an information processing device of the manufacturing apparatus.

When data of log information recorded in this log data is transmitted, an external device, such as a host computer, that monitors and controls the manufacturing apparatus can perform production control, malfunction detection in the apparatus, failure prediction, feedback control, and the like.

A method proposed in Japanese Patent Laid-Open No. 2015-79817 is a method in which pieces of data of pieces of log information of a plurality of modules are transmitted to the outside.

Here, in the external device, the above-described production control and the like are performed by using an identifier used to identify a job for a command for the manufacturing apparatus to operate, an identifier used to identify a material processed by the apparatus, and the like. These identifiers are identifiers shared by the external device and the manufacturing apparatus (hereinafter referred to as external identifiers). Thus, in transmitting the data of the log information, an external identifier has to be added and transmitted.

However, in a control unit of the manufacturing apparatus, in some cases, an identifier, such as an identifier used to identify a job for a command to operate, is recorded in log information by using only an identifier used in the manufacturing apparatus (hereinafter referred to as an internal identifier). Thus, when the data of the log information is transmitted, in some cases, data of log information not including information of an external identifier is transmitted, making it impossible to use the data for the above-described production control and the like in the external device.

SUMMARY OF THE INVENTION

A data transmission method according to an aspect of the embodiments is a data transmission method of transmitting data of log information recorded in log data of a manufacturing apparatus to an external device. The data transmission method includes: storing correspondence information between information of a first identifier and information of a second identifier, the first identifier being an identifier used to identify a thing about a process performed by the manufacturing apparatus and being shared by the manufacturing apparatus and the external device, the second identifier being an identifier used to identify a thing about a process performed by the manufacturing apparatus and being used by the manufacturing apparatus; and obtaining, based on the correspondence information, information of the first identifier corresponding to information of the second identifier recorded in log information, and transmitting data of the log information to which the obtained information of the first identifier has been added. The storing and the obtaining are executed by an information processing device.

Further features of the disclosure will become apparent from the following description of exemplary embodiments with reference to the attached drawings.

DESCRIPTION OF THE EMBODIMENTS

Exemplary embodiments of the disclosure will be described in detail below with reference to the drawings. In the following embodiments, an example where an exposure apparatus is used as a manufacturing apparatus will be described. The same members throughout figures are designated by the same reference numerals, and repeated descriptions thereof are omitted.

First Embodiment

Figure 1:
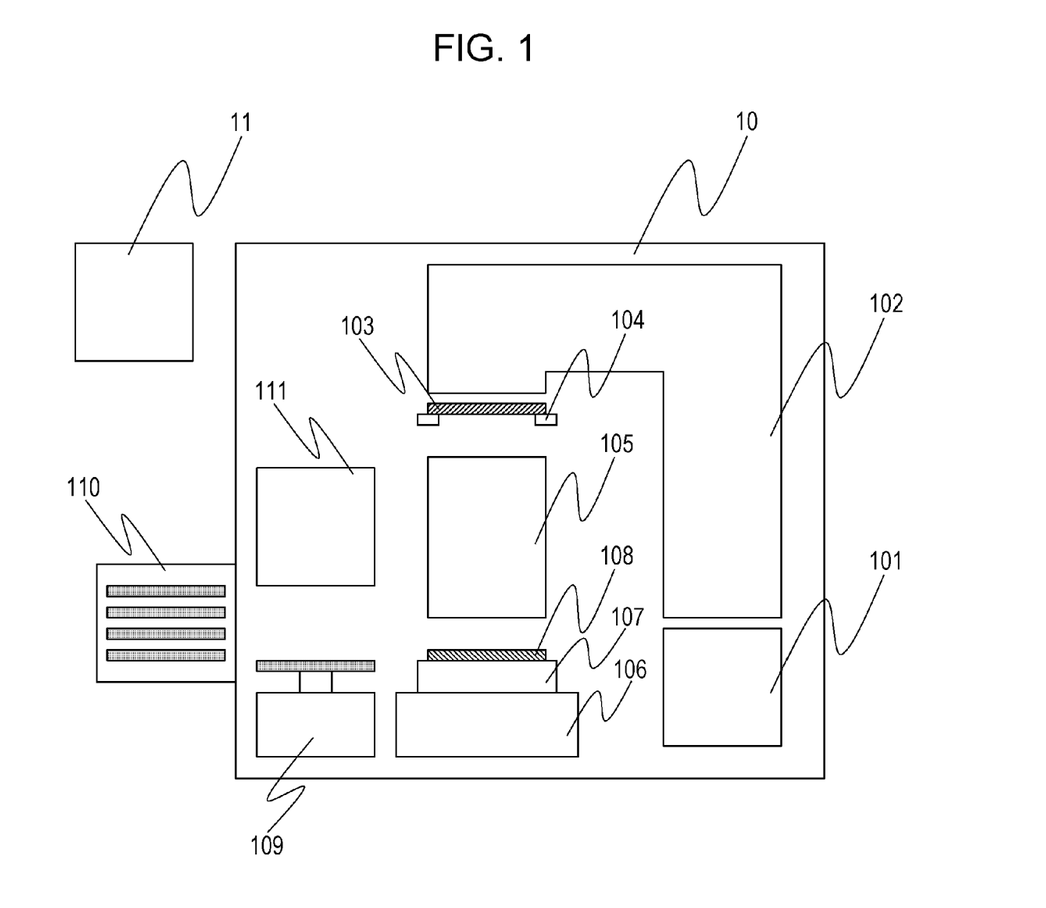
FIG. 1 illustrates the configuration of an exposure apparatus and a host computer.

FIG. 1 illustrates the configuration of an exposure apparatus and a host computer. As illustrated in FIG. 1, an exposure apparatus 10 can include a light source unit 101, an illumination system 102, a mask stage 104, an optical projection system 105, a wafer stage 106, a wafer chuck 107, a pre-alignment unit 109, and a control unit 111.

Light emitted from the light source unit 101 illuminates a mask 103 held by the mask stage 104 via the illumination system 102. Examples of a light source of the light source unit 101 include a high pressure mercury lamp, an excimer laser, and the like. In the case where the light source is an excimer laser, the light source unit 101 is not necessarily provided in a chamber of the exposure apparatus 10. The light source unit 101 can be provided externally. On the mask 103, a circuit pattern to be transferred is drawn. The light illuminating the mask 103 passes through the optical projection system 105 to reach a wafer 108. Examples of the wafer 108 include a silicon wafer, a glass plate, a film substrate, and the like.

The pattern on the mask 103 is transferred, via the optical projection system 105, to a photosensitive medium (for example, resist) with which the wafer 108 is coated. The wafer 108 is held by the wafer chuck 107 in such a manner that it is made flat by a method, such as vacuum suction. The wafer chuck 107 is held by the wafer stage 106. The wafer stage 106 is movable. Exposure is repeatedly performed on a plurality of shot regions of the wafer 108 while the wafer stage 106 is two-dimensionally moved stepwise along a surface perpendicular to an optical axis of the optical projection system 105. This is an exposure method called a step-and-repeat method. There is also an exposure method called a step-and-scan method in which scanning and exposure are performed with the mask stage 104 and the wafer stage 106 being synchronized. A first embodiment can also be applied to an exposure apparatus employing such a method.

In the exposure apparatus 10, wafers 108 to be subjected to an exposure process are loaded into the exposure apparatus 10 with them placed in a wafer cassette 110. In the wafer cassette 110, at least one wafer 108 is stored, and a plurality of wafers 108 are typically stored. One wafer 108 is taken out of the wafer cassette 110 by a robot hand or the like, which is not illustrated, and is placed in the pre-alignment unit 109. In the pre-alignment unit 109, orientation adjustment, alignment, and the like are performed on the wafer 108, and then the wafer 108 is placed on the wafer chuck 107 by the robot hand and is subjected to the exposure process. The wafer 108 subjected to the exposure process is taken out of the wafer chuck 107 by the robot hand and is returned to the wafer cassette 110, and simultaneously, a subsequent wafer 108 being on standby in the pre-alignment unit 109 is placed on the wafer chuck 107. In this way, wafers 108 are sequentially subjected to the exposure process. In the case where the exposure apparatus 10 is connected to another apparatus, such as a coating/developing apparatus (not illustrated), in an in-line manner, a wafer 108 to be subjected to an exposure process may be conveyed from the other apparatus, and the wafer 108 subjected to the exposure process may be conveyed to the other apparatus.

The control unit 111 is an information processing device, such as a computer. The control unit 111 controls each unit or device of the exposure apparatus 10 and performs various arithmetic operations. In the example illustrated in FIG. 1, although one control unit 111 is provided, the number of control units 111 is not limited to one. A plurality of control units 111 may be provided for the respective units or devices of the exposure apparatus 10.

A host computer 11 is an information processing device connected to the exposure apparatus 10 via a network or the like. The host computer 11 monitors and controls the exposure apparatus 10. The host computer 11 is also connected to a device other than the exposure apparatus 10, and similarly monitors and controls another manufacturing apparatus or the like. For example, the host computer 11 executes a job for a command for the exposure apparatus 10 to operate. At this time, the host computer 11 adds information of an external identifier (first identifier) to the job and transmits information of the job to the exposure apparatus 10.

Here, an external identifier is an identifier shared by an external device, such as the host computer 11, and the exposure apparatus 10. Examples of an external identifier include "JobID" that is an identifier used to identify a job, "WaferID" that is an identifier used to identify a wafer processed by the exposure apparatus 10, and the like. Information indicating an attribute of a job, such as a lot name, a recipe name, or a job step name, may also be used as an external identifier. Information indicating an attribute of a wafer, such as a wafer cassette where the wafer belongs, or slots of the wafer cassette, may also be used as an external identifier. Information indicating an attribute of a mask, such as an identifier of the mask, may also be used as an external identifier. That is, an external identifier is an identifier used to identify a thing about a process performed by the exposure apparatus 10.

This embodiment is not limited to the case where an external identifier is obtained from the host computer 11. For example, "WaferID" that is an external identifier used to identify a wafer may be obtained from another manufacturing apparatus, such as a coating/developing apparatus (not illustrated) connected to the exposure apparatus 10 in an in-line manner. Also, "MaskID" that is an external identifier used to identify the mask 103 may be obtained by reading a bar code or the like on the mask 103 with a mask conveying unit (not illustrated).

Figure 2:
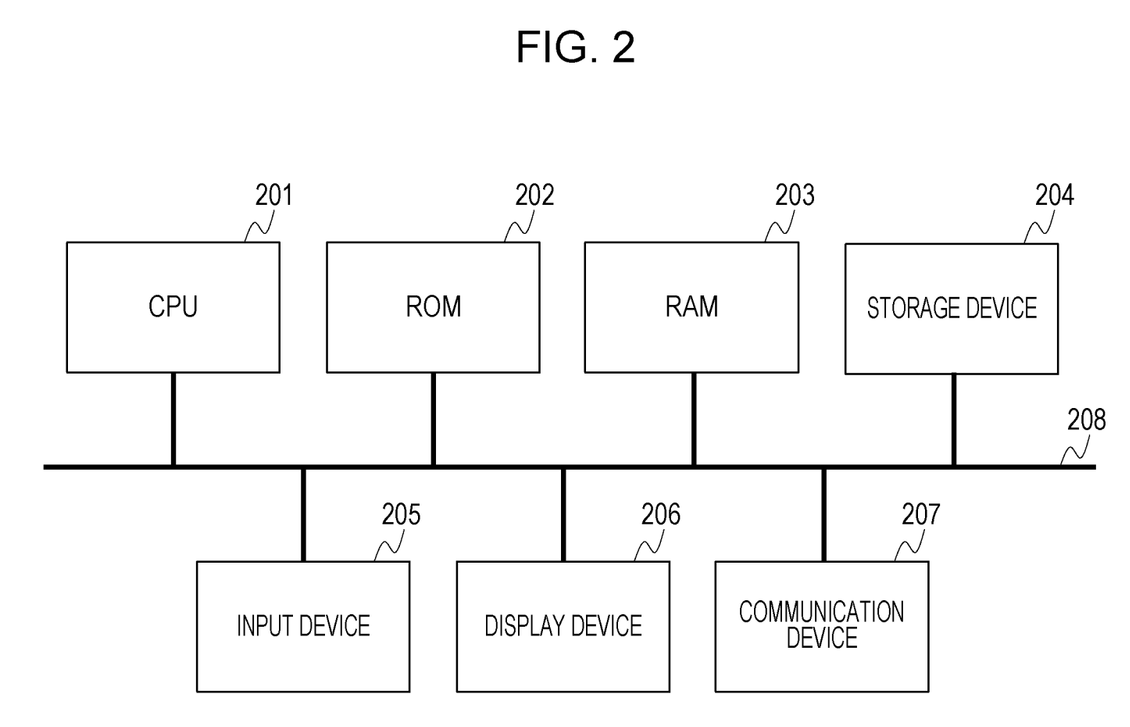
FIG. 2 is a block diagram illustrating a hardware configuration of an information processing device.

FIG. 2 is a block diagram illustrating a hardware configuration of an information processing device capable of performing a data transmission method. This method is performed by causing a processing unit (central processing unit (CPU), micro processing unit (MPU), or the like) of a computer to read a program. Software or a program implementing functions of the information processing device is supplied to an information processing device including one or a plurality of computers via a network or each of various storage media. The program is executed by causing a processing unit of the information processing device to read the program recorded or stored in a recording medium or storage medium. Various processes of the program may be performed by causing computers positioned away from each other to transmit and receive data to and from each other via wired or wireless communication. The information processing device may be a server connected to the exposure apparatus 10 and may be placed in the exposure apparatus 10. Alternatively, the information processing device may be the information processing device serving as the control unit 111.

In the example illustrated in FIG. 2, a CPU 201 is a processing unit that performs an arithmetic operation for each type of data processing regarding data transmission and controls components connected to a bus 208. A read only memory (ROM) 202 is a memory for only reading data and stores a basic control program. A random access memory (RAM) 203 is a memory for reading and writing data and is used for storing transmission data 305 to be described. The RAM 203 is also used for temporarily storing various arithmetic operations performed by the CPU 201, data, and the like. A storage device 204 is used for storing data, such as correspondence information 303 and log data 304, which are to be described. The storage device 204 is also used as a temporary storage area used for a system program of an operating system (OS) of the information processing device and during processing of program or data. Although the storage device 204 is slower than the RAM 203 in data input/output, the storage device 204 can store large volumes of data. In one or more embodiments, the storage device 204 is a nonvolatile storage device that can permanently store data so that the stored data can be referred to for a long time. Although the storage device 204 is constituted mostly by a magnetic storage device (hard disk drive (HDD)), the storage device 204 may be a device that reads or writes data with an external medium, such as a compact disc (CD), digital versatile disc (DVD), or memory card, being loaded therein.

An input device 205 is a device for inputting characters or data to the information processing device and corresponds to each type of keyboard or mouse, for example. A display device 206 is a device for displaying information for operation of the information processing device, processing results, or the like and corresponds to a cathode-ray tube (CRT) or liquid crystal display, for example.

A communication device 207 connects to a network to perform data communication using a communication protocol, such as transmission control protocol/internet protocol (TCP/IP), and is used in communicating with another information processing device. The communication device 207 receives log information from another control unit and notifies a log processing unit 301 to be described of the log information. The communication device 207 also receives a command from the host computer 11 and notifies a communication processing unit (not illustrated) of the command from the host computer 11.

Figure 3:
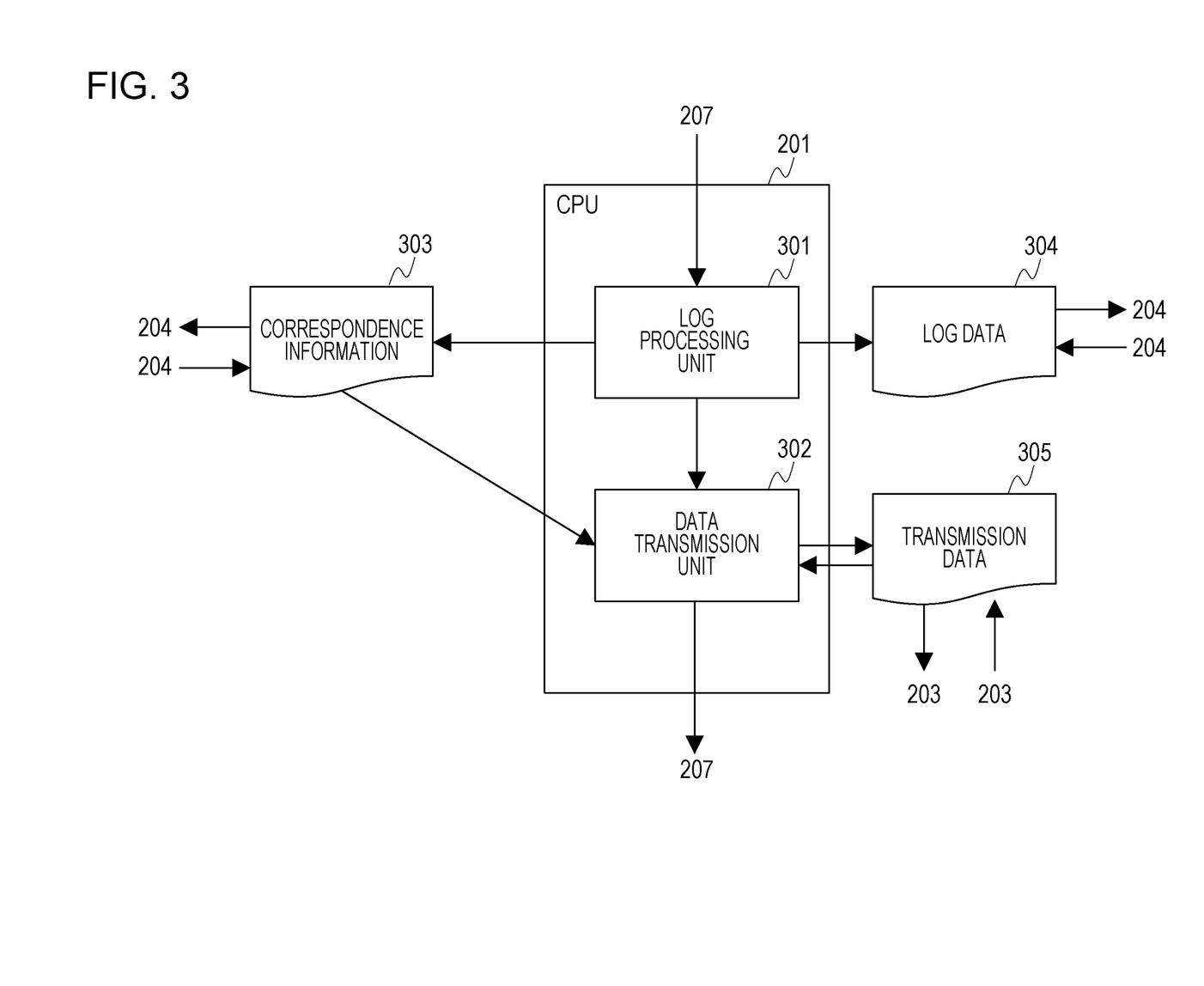
FIG. 3 is a block diagram illustrating the configuration of a central processing unit (CPU).

FIG. 3 is a block diagram illustrating the configuration of the CPU 201. The CPU 201 includes the log processing unit 301 and a data transmission unit 302.

When the log processing unit 301 is notified of log information, the log processing unit 301 records the log information in log data 304 and stores the log data 304 in the storage device 204. Here, the log data 304 is data obtained by collecting pieces of log information in which histories about the operation or control of various devices constituting the exposure apparatus 10 are recorded, for example. The log data 304 is stored in the storage device 204 in a database or file format, for example.

The log processing unit 301 adds a correspondence relationship between information of an external identifier and information of an internal identifier (second identifier) to correspondence information 303 and stores the correspondence information 303 in the storage device 204. Here, an internal identifier is an identifier used in the exposure apparatus 10. As in external identifiers, examples of an internal identifier include "jobNo" that is an identifier used to identify a job, "waferNo" that is an identifier used to identify a wafer processed by the exposure apparatus 10, and the like. Other examples are the same as those of the above-described external identifier. That is, an internal identifier is also an identifier used to identify a thing about a process performed by the exposure apparatus 10. The correspondence information 303 is stored in the storage device 204 in a database or file format, for example. To increase processing speed, the log processing unit 301 may temporarily store the correspondence information 303 in the RAM 203. The log processing unit 301 also notifies the data transmission unit 302 of the log information.

The data transmission unit 302 adds the log information received from the log processing unit 301 to transmission data 305. The transmission data 305 is stored in the RAM 203 in a database or file format, for example. The data transmission unit 302 also obtains information of an external identifier with reference to the correspondence information 303 and adds the information of the external identifier to the transmission data 305. To increase processing speed, the data transmission unit 302 may refer to the correspondence information 303 temporarily stored in the RAM 203. The data transmission unit 302 also reads the transmission data 305 from the RAM 203 to transmit the transmission data 305 to an external information processing device via the communication device 207. Here, an external information processing device may refer to one information processing device or a plurality of information processing devices.

Figure 4:
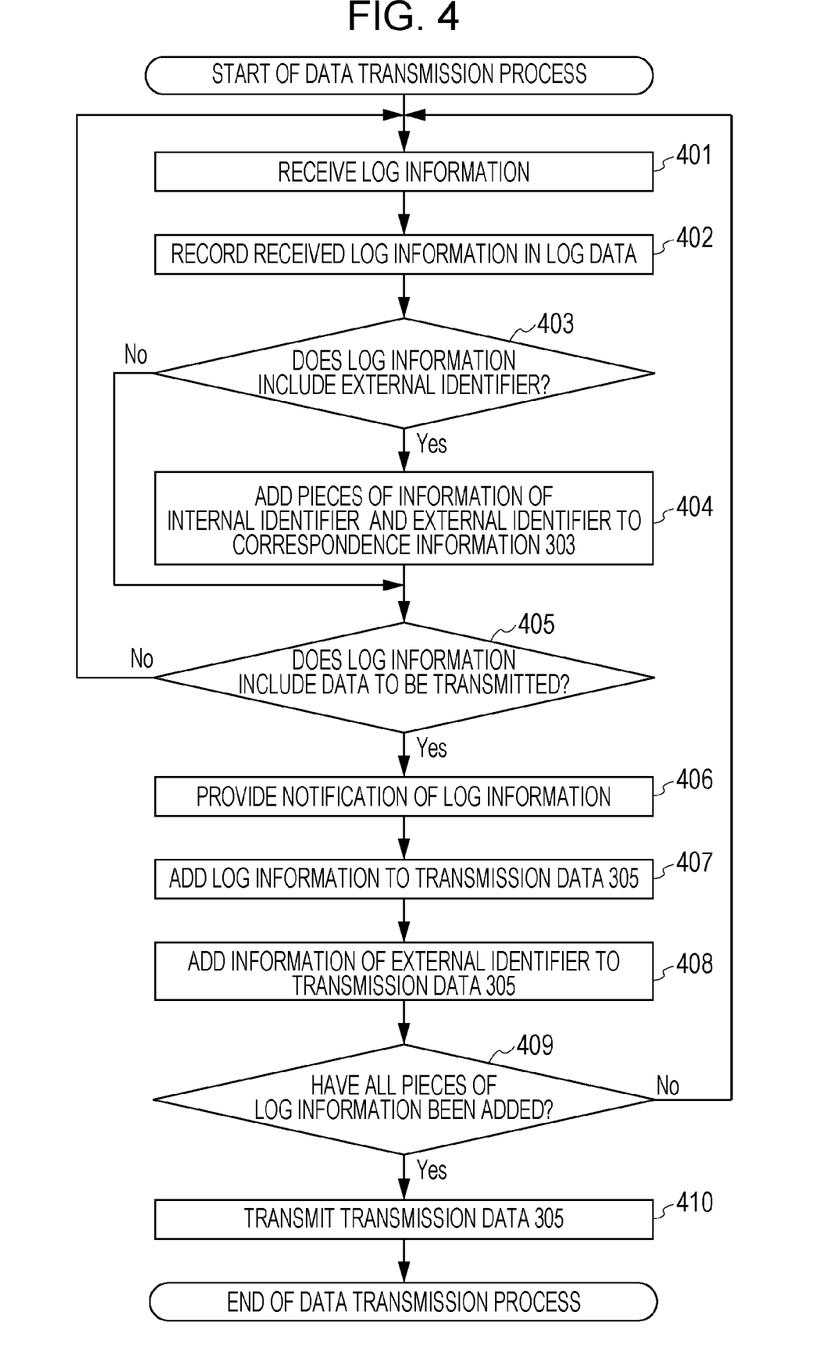
FIG. 4 is a flowchart illustrating a process performed by the CPU according to a first embodiment.

Next, a data transmission method according to this embodiment will be described with reference to FIGS. 4, and 5A to 5J. FIG. 4 is a flowchart illustrating a process performed by the CPU 201 according to the first embodiment. FIGS. 5A to 5J illustrate log data, log information, transmission data, and the like according to the first embodiment.

Figure 5A:
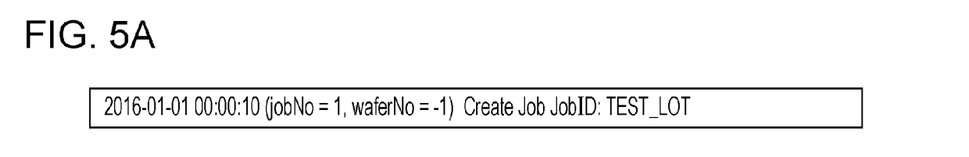
FIGS. 5A to 5J illustrate log data, log information, transmission data, and the like according to the first embodiment.

The log processing unit 301 receives log information from another control unit (step 401). In step 401, the log processing unit 301 may receive log information from another processing unit that operates in the CPU 201. An example of another processing unit is the communication processing unit (not illustrated) that receives a command from the host computer 11 and processes the command from the host computer 11. FIG. 5A illustrates an example of log information received by the log processing unit 301. This log information is log information of which the log processing unit 301 is notified from the communication processing unit if a job for a command to operate is transmitted from the host computer 11. This log information includes information "TEST_LOT" as "JobID", which is an external identifier. Information "1" is also included as "jobNo", which is an internal identifier. Information "Create Job" indicating the type of the log information is also included. Information "2016-01-01 00:00:10" is also included as an event time indicating a date and time when the command from the host computer 11 has been received. In the event time information, "2016-01-01" indicates a date, and "00:00:10" indicates a time. That is, the event time refers to a time when an event indicated by the type of the log information has occurred.

Figure 5B:
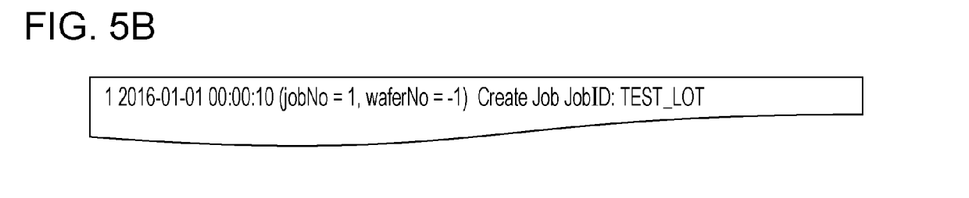

The log processing unit 301 records the received log information in the log data 304 and stores the log data 304 in the storage device 204 (step 402). FIG. 5B illustrates an example of the log information recorded by the log processing unit 301. The same information as the log information illustrated in FIG. 5A is recorded in the log data 304.

The log processing unit 301 determines whether an external identifier is included in the received log information (step 403). If an external identifier is included in the log information, the log processing unit 301 adds pieces of information of the external identifier and an internal identifier to the correspondence information 303 and stores the correspondence information 303 in the storage device 204 (step 404). Keywords "JobID" and "jobNo", which respectively indicate an external identifier and an internal identifier, are stored in the storage device 204 in advance. The log processing unit 301 determines whether an external identifier and an internal identifier are included in the log information with reference to the keywords.

Figure 5C:
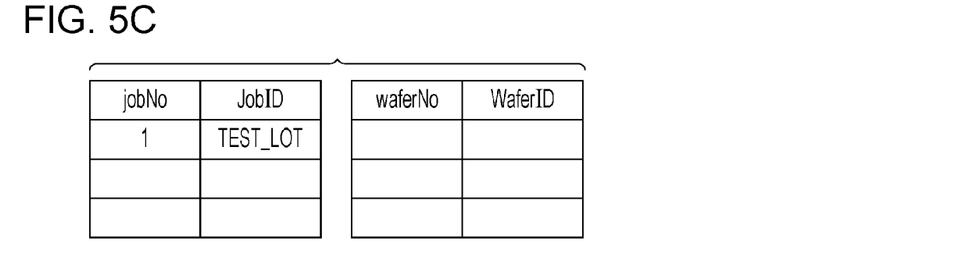

FIG. 5C illustrates an example of the correspondence information 303 stored by the log processing unit 301. This correspondence information 303 indicates information that, with respect to "JobID" and "jobNo", which are respectively an external identifier and an internal identifier, included in the log information, "TEST_LOT" corresponds to "1". That is, "TEST_LOT" and "1" are respectively information of the external identifier and information of the internal identifier that each indicate the same job. The log processing unit 301 associates these pieces of information with each other, adds them to the correspondence information 303, and stores the correspondence information 303 in the storage device 204.

Figure 5D:
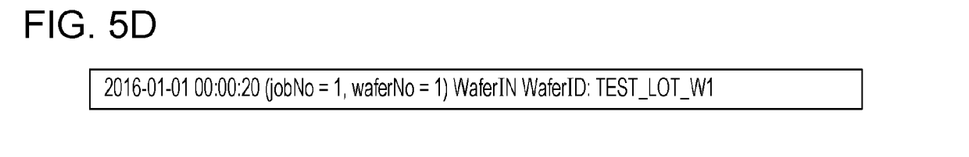

FIG. 5D illustrates another example of log information received by the log processing unit 301. This log information is log information of which the log processing unit 301 is notified from a control unit that controls the conveyance of a wafer if the wafer is conveyed to the exposure apparatus 10. This log information includes information "TEST_LOT_W1" as "WaferID", which is an external identifier. Information "1" is also included as "waferNo", which is an internal identifier. Information "WaferIN" indicating the type of the log information is also included. Information "2016-01-01 00:00:20" is also included as an event time when the wafer has been conveyed to the exposure apparatus 10. The meaning of this event time is the same as that of the event time included in the log information illustrated in FIG. 5A.

Figure 5E:
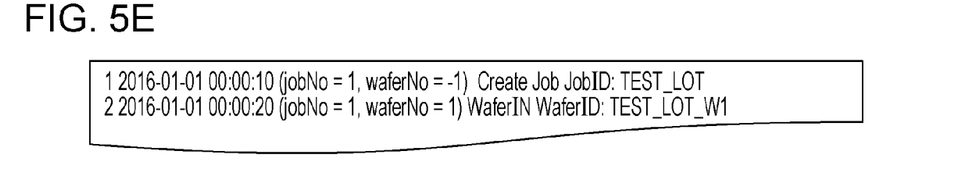

FIG. 5E illustrates another example of the log information recorded by the log processing unit 301. The log processing unit 301 adds the same information as the log information illustrated in FIG. 5D to the log data 304.

Figure 5F:
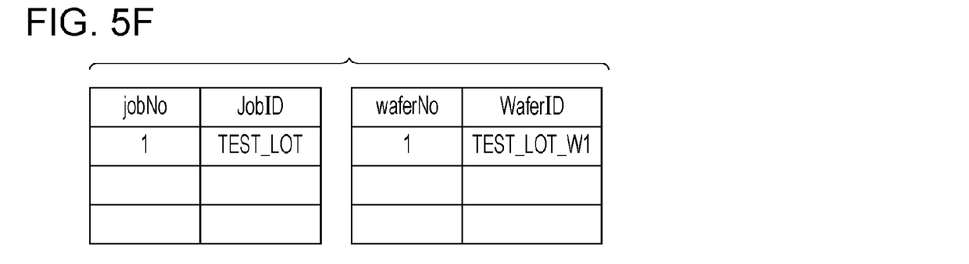

FIG. 5F illustrates another example of the correspondence information 303 stored by the log processing unit 301. This correspondence information 303 indicates information that, with respect to "WaferID" and "waferNo", which are respectively an external identifier and an internal identifier, included in the log information, "TEST_LOT_W1" corresponds to "1". That is, "TEST_LOT_W1" and "1" are respectively information of the external identifier and information of the internal identifier that each indicate the same wafer. The log processing unit 301 associates these pieces of information with each other, adds them to the correspondence information 303, and stores the correspondence information 303 in the storage device 204.

Figure 5G:
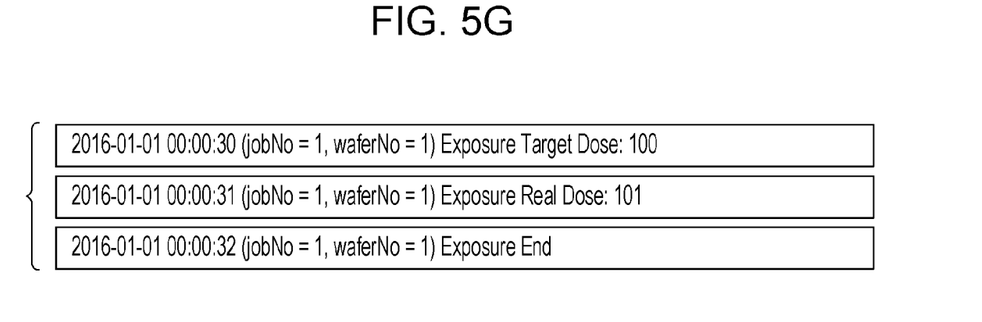

Here, with respect to log information, there are log information not including information of an external identifier and log information including information of an external identifier. FIG. 5G illustrates another example of log information received by the log processing unit 301. The log information illustrated in FIG. 5G is log information not including information of an external identifier, and the pieces of log information illustrated in FIGS. 5A and 5D are each log information including information of an external identifier. Also, with respect to a control unit that controls each unit or device of the exposure apparatus 10, there is a control unit that does not transmit and receive information to and from an external device and thus needs no external identifier. Also, with respect to a processing unit that operates in the CPU 201 and performs control or the like on the exposure apparatus 10, there is a processing unit that similarly needs no external identifier. Thus, no external identifier is included in pieces of log information of which the log processing unit 301 is notified from such a control unit and such a processing unit. In order that an external identifier is included in log information of which the log processing unit 301 is notified from such a control unit or such a processing unit, changes have to be made to control unit and processing unit programs. Furthermore, as the numbers of such control units and such processing units increase, changes have to be made to the programs on an increasing scale.

In S403, if it is determined that no external identifier is included in the log information, the log processing unit 301 does not store the correspondence information 303 and proceeds to step 405.

The log processing unit 301 determines whether the received log information includes data to be transmitted to the outside (step 405). Here, with respect to log information, there are log information including data to be transmitted to the outside and log information not including data to be transmitted to the outside. Discrimination information for discriminating between the two types of log information is stored in the storage device 204, and the log processing unit 301 determines, with reference to the discrimination information, whether the log information includes data to be transmitted to the outside. If the log information includes data to be transmitted to the outside, the log processing unit 301 notifies the data transmission unit 302 of the received log information (step 406). Information indicating whether the log information includes data to be transmitted to the outside is stored in the storage device 204 in advance. As the information, for example, the type of the log information is stored. The log processing unit 301 determines, with reference to the information, whether the log information includes data to be transmitted to the outside. If the log information includes no data to be transmitted to the outside, the process returns to step 401.

When the data transmission unit 302 receives the log information from the log processing unit 301, the data transmission unit 302 adds the log information to the transmission data 305 and stores the transmission data 305 in the RAM 203 (step 407).

Figure 5H:
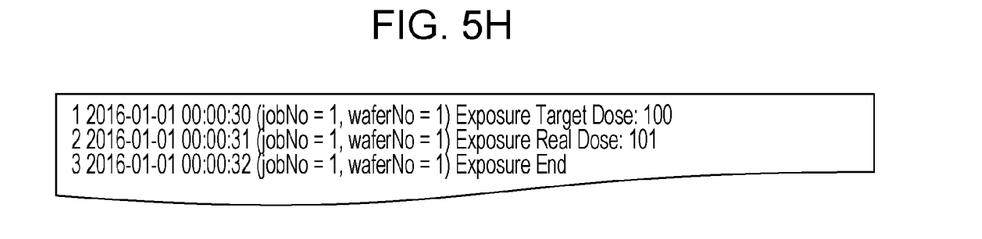

Here, FIG. 5H illustrates an example of the transmission data 305 in which the data transmission unit 302 has stored the log information. With respect to the transmission data 305, there are data including only one piece of log information and data including a plurality of pieces of log information. FIG. 5H illustrates the transmission data 305 including a plurality of pieces of log information.

Figure 5I:
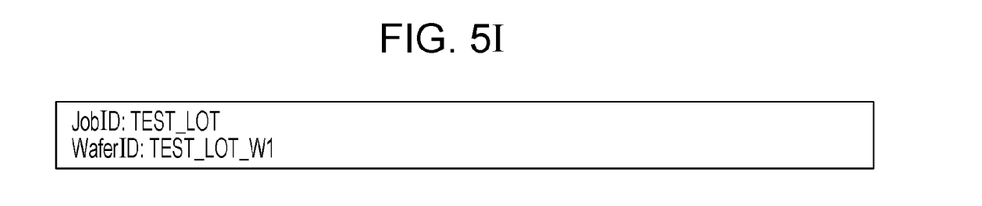

The data transmission unit 302 obtains information of an external identifier corresponding to information of the internal identifier included in the log information with reference to the correspondence information 303, adds the obtained information of the external identifier to the transmission data 305, and stores the transmission data 305 in the RAM 203 (step 408). FIG. 5I illustrates an example of obtained pieces of information of external identifiers. FIG. 5I illustrates that information "TEST_LOT" and information "TEST_LOT_W1" have respectively been obtained as "JobID" and "WaferID", which are external identifiers.

Here, in the case where data to be transmitted includes a plurality of pieces of log information, in step 408, the data transmission unit 302 may obtain information of an external identifier on the basis of one piece of log information among the plurality of pieces of log information and add the obtained information to the transmission data 305. For this, log information for which information of an external identifier is to be obtained is stored in the storage device 204, and thus the data transmission unit 302 determines, with reference to the information, whether information of an external identifier is to be obtained and added. Also, in step 408, the data transmission unit 302 may determine, with reference to the transmission data 305, whether information of an external identifier has been added, and, if the information of the external identifier has been added, the data transmission unit 302 does not have to obtain and add the information of the external identifier.

Figure 5J:
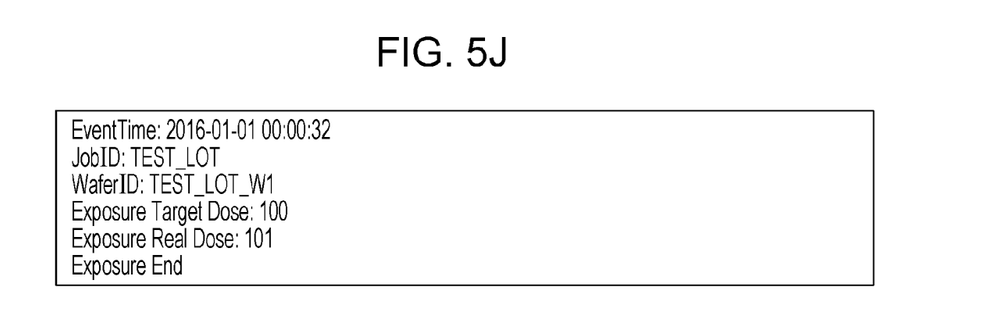

Here, FIG. 5J illustrates an example of the transmission data 305 to which pieces of information of external identifiers have been added. In the example, external identifiers "JobID" and "WaferID" obtained from the correspondence information 303 and their respective pieces of information "TEST_LOT" and "TEST_LOT_W1" have been added to the transmission data 305. Furthermore, FIG. 5J illustrates an example where the transmission data 305 is edited on the basis of a format stored in the storage device 204 in advance before transmission of the transmission data 305 and is then transmitted. In transmission of the transmission data 305, the transmission data 305 may be transmitted without being edited.

The data transmission unit 302 determines whether all pieces of log information to be transmitted have been added to the transmission data 305 (step 409). Information indicating which log information is included in data to be transmitted is stored in the storage device 204 in advance. The data transmission unit 302 determines, with reference to the information, whether all pieces of log information to be transmitted have been added to the transmission data 305.

If all pieces of log information have been added, the data transmission unit 302 transmits the transmission data 305 to an external information processing device (step 410). If all pieces of log information have not been added, the process returns to step 401.

In FIG. 4, although the process in which one piece of data is transmitted is described, steps 401 to 410 may be performed repeatedly to transmit a plurality of pieces of data.

Thus, according to the data transmission method in this embodiment, data to which information of an external identifier has been added can be transmitted. When data to which information of an external identifier has been added is transmitted, production control, malfunction detection in an apparatus, failure prediction, feedback control, and the like can be performed by using the transmitted data in an external device. Furthermore, data to which information of an external identifier has been added can be transmitted without making changes to a program that controls an exposure apparatus.

Second Embodiment

A second embodiment of the disclosure will be described below, and matters not described in this embodiment can follow the description of the first embodiment. In the first embodiment, the method is described in which log information is received from a control unit or the like to transmit data. In the second embodiment, a method will be described, with reference to FIGS. 6, 7A and 7B, in which the log processing unit 301 reads the stored log data 304 to transmit data.

Figure 6:
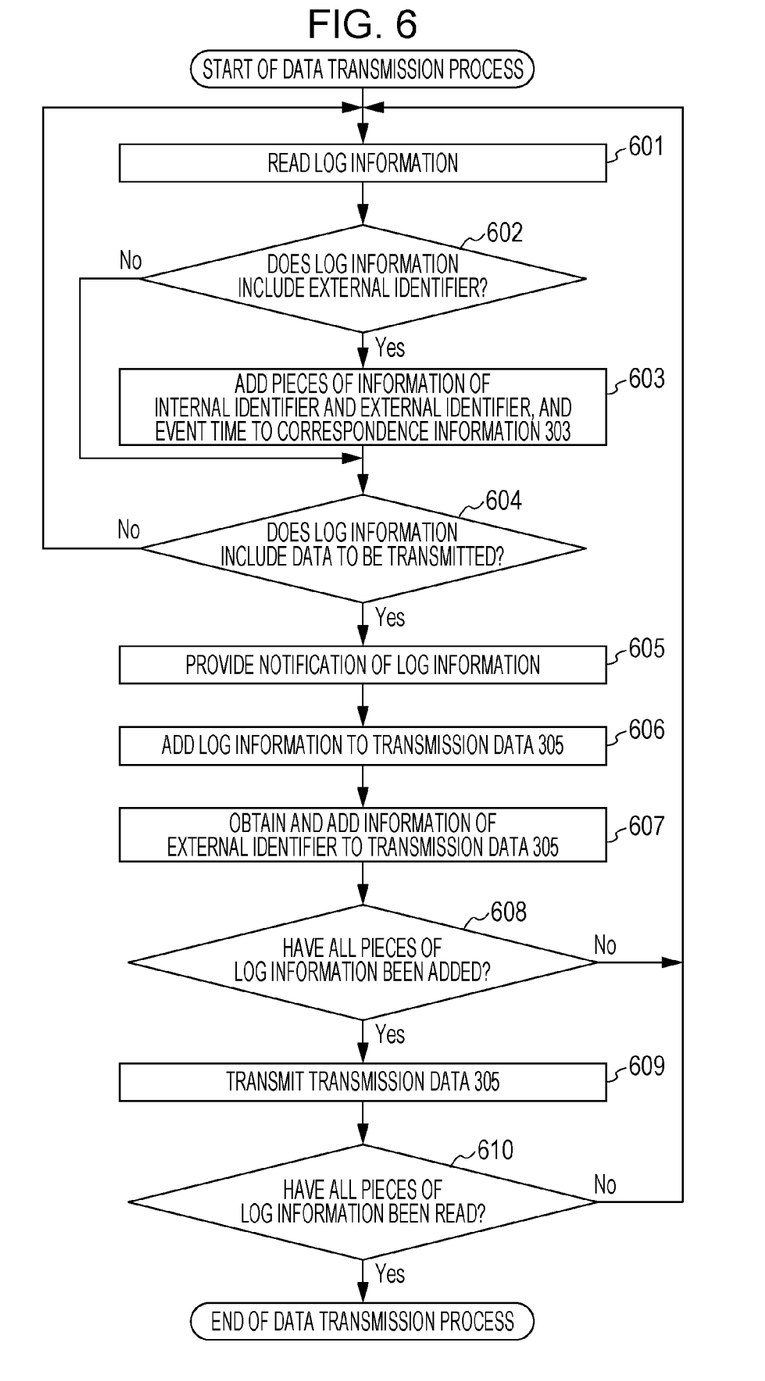
FIG. 6 is a flowchart illustrating a process performed by the CPU according to a second embodiment.
Figure 7A:
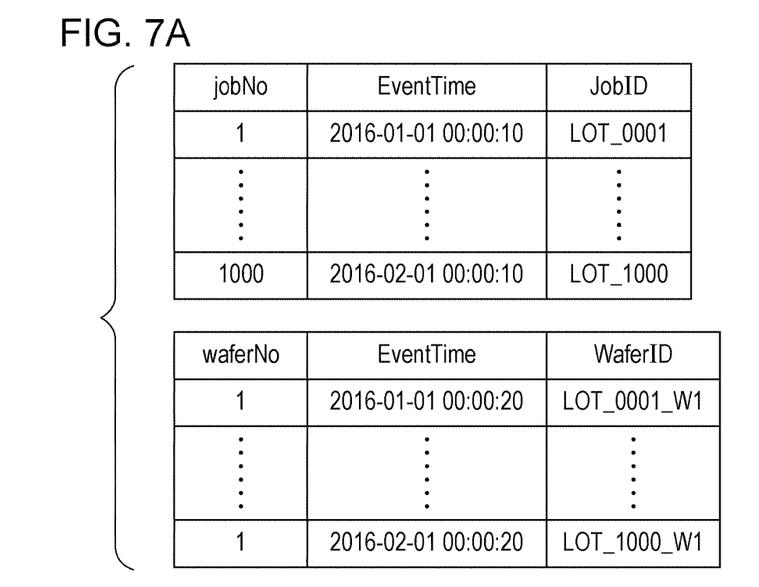
FIGS. 7A and 7B illustrate log data, log information, transmission data, and the like according to the second embodiment.
Figure 7B:
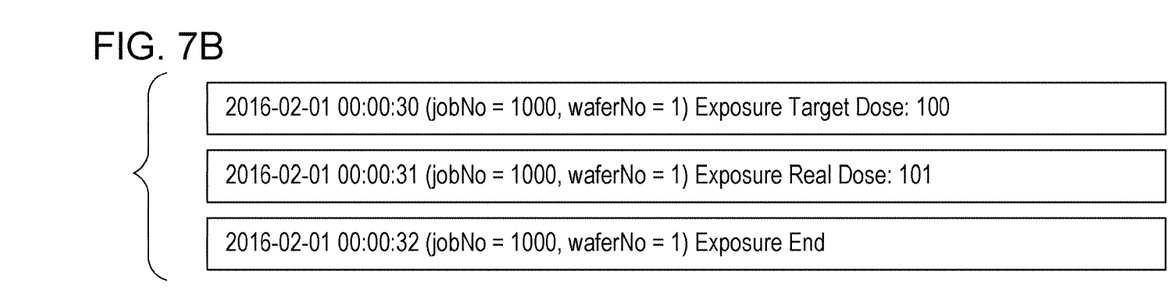

FIG. 6 is a flowchart illustrating a process performed by the CPU according to the second embodiment. FIGS. 7A and 7B illustrate log data, log information, transmission data, and the like according to the second embodiment.

The log processing unit 301 reads log information from the log data 304 (step 601). Log information to be read is information of the log data 304 illustrated in FIG. 5B or 5E, for example.

The log processing unit 301 determines whether an external identifier is included in the log information read from the log data 304 (step 602). If an external identifier is included in the log information, the log processing unit 301 adds pieces of information of the external identifier and an internal identifier of the read log information to the correspondence information 303 and stores the correspondence information 303 in the storage device 204 (step 603).

FIG. 7A illustrates an example of the correspondence information 303 stored by the log processing unit 301. The log processing unit 301 adds, in addition to pieces of information of an internal identifier and an external identifier described in the first embodiment, an event time to the correspondence information 303 and stores the correspondence information 303. For example, information "2016-01-01 00:00:10" is stored as "EventTime" that is an event time. Here, pieces of information of "jobNo" and "waferNo", which are internal identifiers, are each a serial number that returns to an initial number if the serial number exceeds a certain number. The certain number is typically set to a sufficiently big number so as to avoid duplication of information of an internal identifier. However, in some cases, if the exposure apparatus 10 has been operating for long periods, a number of the internal identifier reaches the certain number and returns to the initial number. In this case, in the log data 304, identical pieces of information of the internal identifier are added to pieces of log information corresponding to different pieces of information of an external identifier. Thus, in the correspondence information 303 as well, there are the identical pieces of information of the internal identifier corresponding to the respective different pieces of information of the external identifier. For example, FIG. 7A illustrates an example of the correspondence information 303 stored from log information read from the log data 304 in the case where the apparatus has been operating for long periods. For example, both pieces of information of "waferNo", which is an internal identifier, corresponding to pieces of information "LOT_0001_W1" and "LOT_1000_W1" of "WaferID", which is an external identifier, are "1", that is, duplication has occurred. If there are identical pieces of information of the internal identifier in the correspondence information 303 as just described above, a situation occurs in that the log processing unit 301 is not able to obtain correct information of the external identifier. Thus, in order that the log processing unit 301 obtains correct information of the external identifier, the log processing unit 301 adds an event time together with pieces of information of the external identifier and the internal identifier to the correspondence information 303 and stores the correspondence information 303 in the storage device 204.

Here, as described above, a number of the internal identifier returns to an initial number if the number exceeds a sufficiently big number. As a result, a period of time that elapses before duplicate information of the internal identifier is used is also sufficiently long. Thus, if there are identical pieces of information of the internal identifier in the correspondence information 303, when an event time of log information is compared with an event time in the correspondence information 303, correct information of the external identifier can be obtained.

Steps 604 to 606 in FIG. 6 are the same as steps 405 to 407 in FIG. 4, and thus descriptions thereof are omitted.

The data transmission unit 302 obtains information of an external identifier corresponding to information of the internal identifier included in the log information with reference to the stored correspondence information 303 and adds the information of the external identifier to the transmission data 305 (step 607). At this time, if there are a plurality of pieces of information of the external identifier corresponding to the information of the internal identifier in the correspondence information 303, a piece of information of the external identifier corresponding to an event time close to an event time of the log information is obtained. Thus, correct information of the external identifier can be obtained.

FIG. 7B illustrates an example of pieces of log information read from the log data 304. In all the pieces of log information, information of "waferNo", which is an internal identifier, is "1". In the correspondence information 303 illustrated in FIG. 7A, there are pieces of information "LOT_0001_W1" and "LOT_1000_W1" of "WaferID", which is an external identifier, corresponding to the internal identifier that is "waferNo" whose information is "1". However, event times of "EventTime" corresponding to the respective pieces of information of the external identifier are "2016-01-01 00:00:20" and "2016-02-01 00:00:20" and thus are different from each other. Thus, of the event times corresponding to identical pieces of information of the internal identifier, a piece of information of the external identifier corresponding to an event time closest to an event time of log information is obtained. In FIG. 7B, for example, assume that an event time of log information is "2016-02-01 00:00:30". The respective event times corresponding to the identical pieces of information of the internal identifier are "2016-01-01 00:00:20" and "2016-02-01 00:00:20". The event time of the log information is compared with the respective event times corresponding to the identical pieces of information of the internal identifier, and "2016-02-01 00:00:20" that is an event time close to "2016-02-01 00:00:30" is selected. As a result, the data transmission unit 302 can obtain "LOT_1000_W1" as information of "WaferID", which is an external identifier, corresponding to the selected event time. Thus, in the correspondence information 303, if there are a plurality of identical pieces of information of an internal identifier corresponding to different pieces of information of an external identifier, among event times of the plurality of pieces of information of the internal identifier, a piece of information of the external identifier corresponding to an event time closest to an event time of log information may be obtained.

Steps 608 and 609 in FIG. 6 are the same as steps 409 and 410 in FIG. 4, and thus descriptions thereof are omitted.

The log processing unit 301 determines whether all pieces of log information have been read from the log data 304 (step 610). If all pieces of log information have been read, the data transmission process ends. If all pieces of log information have not been read, the process returns to step 601.

In the data transmission method according to the first embodiment, an event time may be added to and stored in the correspondence information 303 as in the data transmission method according to the second embodiment. Even in the case where data transmission according to the first embodiment is performed, if there are identical pieces of information of an internal identifier in the correspondence information 303, the log processing unit 301 can obtain correct information of an external identifier.

In the case where data transmission according to the second embodiment is performed after data transmission according to the first embodiment is performed, the correspondence information 303 is not stored, and the correspondence information 303 stored when the data transmission according to the first embodiment is performed may be used. This can reduce processing time taken to perform the data transmission according to the second embodiment.

Thus, according to the data transmission method in this embodiment, data to which information of an external identifier has been added can be transmitted. When data to which information of an external identifier has been added is transmitted, production control, malfunction detection in an apparatus, failure prediction, feedback control, and the like can be performed by using the transmitted data in an external device. Data to which information of an external identifier has been added can be transmitted without making changes to a program that controls an exposure apparatus. Furthermore, in log data, even in the case where there are identical pieces of information of an internal identifier in pieces of log information corresponding to different pieces of information of an external identifier, data to which a correct piece of information of the external identifier has been added can be transmitted.

(Method of Manufacturing Product)

A method of manufacturing a product, such as a device (semiconductor device, magnetic storage medium, or liquid crystal display device, for example), a color filter, or a hard disk, will be described. Such a manufacturing method includes a step of forming a pattern on a substrate (wafer, glass plate, or film substrate, for example) by using a lithography apparatus (exposure apparatus, imprint apparatus, or drawing apparatus, for example). The manufacturing method further includes a step of processing the substrate on which the pattern has been formed. The step of processing can include a step of removing a residual layer of the pattern. The step of processing can also include another known step, such as a step of etching the substrate by causing the pattern to serve as a mask. The method of manufacturing a product in this embodiment may have an advantage over existing methods in terms of at least one of product's performance, quality, productivity, and production costs.

Although the exemplary embodiments of the disclosure are described above, the disclosure is not limited to these embodiments, and various modifications and changes can be made within the scope of the gist of the disclosure. Although, as an example of a manufacturing apparatus, an exposure apparatus that forms a pattern by exposing a substrate to light is described, the manufacturing apparatus is not limited to the exposure apparatus. An example of the manufacturing apparatus may be an apparatus, such as a drawing apparatus that performs drawing on a substrate with a charged-particle beam (electron beam, ion beam, or the like) via a charged-particle optical system to form a pattern on the substrate. An example of the manufacturing apparatus may be an imprint apparatus that shapes an imprint material (resin, or the like) on a substrate with a mold to form a pattern on the substrate. Included among these manufacturing apparatuses can also be a manufacturing apparatus that performs a step other than steps performed by lithography apparatuses like the ones described above in manufacturing a product, such as a device. Examples of the manufacturing apparatus include a coating apparatus that coats the surface of a substrate with a photosensitive medium, and a developing apparatus that develops a substrate on which a pattern has been transferred.

The first and second embodiments can be implemented not only separately but also in combination.

The disclosure can provide a data transmission method, a non-transitory storage medium, a data transmission device, a lithography apparatus, and a method of manufacturing a product that each enables data to which information of an external identifier has been added to be transmitted.

Other Embodiments

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™, a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-082317 filed Apr. 15, 2016, which is hereby incorporated by reference herein in its entirety.

What is claimed is:

1. A data transmission method of transmitting data of log information recorded in log data of a manufacturing apparatus to an external device, the data transmission method comprising:
    storing correspondence information including information of a first identifier and information of a second identifier corresponding to the first identifier, the first identifier being an identifier used to identify a thing about a process performed by the manufacturing apparatus and being used by both of the manufacturing apparatus and the external device, the second identifier being an identifier used to identify a thing about a process performed by the manufacturing apparatus and being used by the manufacturing apparatus; and
    obtaining, based on the correspondence information, information of the first identifier corresponding to information of the second identifier recorded in log information, and transmitting data of the log information to which the obtained information of the first identifier has been added,
    wherein the storing and the obtaining are executed by an information processing apparatus,
    wherein, in the storing, information of an event time corresponding to the information of the first identifier and the information of the second identifier is added, and correspondence information is stored, and
    wherein, in the obtaining, if there are a plurality of identical pieces of information of the second identifier of the log information in the correspondence information, information of an event time corresponding to a piece of information of the second identifier closest to information of an event time of the log information is obtained based on the correspondence information, and information of the first identifier corresponding to the information of the event time is acquired.

2. The data transmission method according to claim 1, wherein information of the second identifier is a serial number that returns to an initial number if the serial number exceeds a certain number.

3. The data transmission method according to claim 1, wherein the log information includes log information including information of the first identifier and log information not including information of the first identifier.

4. The data transmission method according to claim 1, wherein the transmitting includes transmitting data of the log information every time the log information is recorded.

5. The data transmission method according to claim 1, wherein the obtaining includes reading the log information from the log data and transmitting data of the log information.

6. The data transmission method according to claim 1, wherein the manufacturing apparatus is a lithography apparatus that forms a pattern on a substrate.

7. A non-transitory storage medium storing a program that causes an information processing device to perform a data transmission method of transmitting data of log information recorded in log data of a manufacturing apparatus to an external device,
    wherein the data transmission method comprises:
    storing correspondence information including information of a first identifier and information of a second identifier corresponding to the first identifier, the first identifier being an identifier used to identify a thing about a process performed by the manufacturing apparatus and being used by both of the manufacturing apparatus and the external device, the second identifier being an identifier used to identify a thing about a process performed by the manufacturing apparatus and being used by the manufacturing apparatus; and
    obtaining, based on the correspondence information, information of the first identifier corresponding to information of the second identifier recorded in log information, and transmitting data of the log information to which the obtained information of the first identifier has been added;
    wherein, in the storing, information of an event time corresponding to the information of the first identifier and the information of the second identifier is added, and correspondence information is stored, and
    wherein, in the obtaining, if there are a plurality of identical pieces of information of the second identifier of the log information in the correspondence information, information of an event time corresponding to a piece of information of the second identifier closest to information of an event time of the log information is obtained based on the correspondence information, and information of the first identifier corresponding to the information of the event time is acquired.

8. The non-transitory storage medium according to claim 7, wherein the log information includes log information including information of the first identifier and log information not including information of the first identifier.

9. The non-transitory storage medium according to claim 7, wherein the transmitting includes transmitting data of the log information every time the log information is recorded.

10. The non-transitory storage medium according to claim 7, wherein the obtaining includes reading the log information from the log data and transmitting data of the log information.

11. A data transmission device that transmits data of log information recorded in log data of a manufacturing apparatus to an external device, the data transmission device comprising:
    a storage unit that stores correspondence information including information of a first identifier and information of a second identifier corresponding to the first identifier, the first identifier being an identifier used to identify a thing about a process performed by the manufacturing apparatus and being used by both of the manufacturing apparatus and the external device, the second identifier being an identifier used to identify a thing about a process performed by the manufacturing apparatus and being used by the manufacturing apparatus; and a data transmission unit that obtains, based on the correspondence information, information of the first identifier corresponding to information of the second identifier recorded in log information, and transmits data of the log information to which the obtained information of the first identifier has been added, wherein, in the storage unit, information of an event time corresponding to the information of the first identifier and the information of the second identifier is added, and correspondence information is stored, and wherein, if there are a plurality of identical pieces of information of the second identifier of the log information in the correspondence information, information of an event time corresponding to a piece of information of the second identifier closest to information of an event time of the log information is obtained based on the correspondence information, and information of the first identifier corresponding to the information of the event time is acquired.

12. The data transmission device according to claim 11, wherein the log information includes log information including information of the first identifier and log information not including information of the first identifier.

13. The data transmission device according to claim 11, wherein the data transmission unit transmits data of the log information every time the log information is recorded.

14. The data transmission device according to claim 11, wherein the data transmission unit reads the log information from the log data and transmits data of the log information.

15. A lithography apparatus that forms a pattern on a substrate, the lithography apparatus comprising a data transmission device that transmits data of log information recorded in log data of a manufacturing apparatus to an external device, wherein the data transmission device includes a storage unit that stores correspondence information including information of a first identifier and information of a second identifier corresponding to the first identifier, the first identifier being an identifier used to identify a thing about a process performed by the manufacturing apparatus and being used by both of the manufacturing apparatus and the external device, the second identifier being an identifier used to identify a thing about a process performed by the manufacturing apparatus and being used by the manufacturing apparatus, and a data transmission unit that obtains, based on the correspondence information, information of the first identifier corresponding to information of the second identifier recorded in log information, and transmits data of the log information to which the obtained information of the first identifier has been added, wherein, in the storage unit, information of an event time corresponding to the information of the first identifier and the information of the second identifier is added, and correspondence information is stored, and wherein, if there are a plurality of identical pieces of information of the second identifier of the log information in the correspondence information, information of an event time corresponding to a piece of information of the second identifier closest to information of an event time of the log information is obtained based on the correspondence information, and information of the first identifier corresponding to the information of the event time is acquired.

16. The lithography apparatus according to claim 15, wherein the data transmission unit transmits data of the log information every time the log information is recorded.

17. A method of manufacturing a product, the method comprising:

forming a pattern on a substrate by using a lithography apparatus; and processing the substrate on which the pattern has been formed, wherein a product is manufactured from the processed substrate, wherein the lithography apparatus includes a data transmission device that transmits data of log information recorded in log data of a manufacturing apparatus to an external device, and wherein the data transmission device includes a storage unit that stores correspondence information including information of a first identifier and information of a second identifier corresponding to the first identifier, the first identifier being an identifier used to identify a thing about a process performed by the manufacturing apparatus and being used by both of the manufacturing apparatus and the external device, the second identifier being an identifier used to identify a thing about a process performed by the manufacturing apparatus and being used by the manufacturing apparatus, and a data transmission unit that obtains, based on the correspondence information, information of the first identifier corresponding to information of the second identifier recorded in log information, and transmits data of the log information to which the obtained information of the first identifier has been added, wherein, in the storage unit, information of an event time corresponding to the information of the first identifier and the information of the second identifier is added, and correspondence information is stored, and wherein, if there are a plurality of identical pieces of information of the second identifier of the log information in the correspondence information, information of an event time corresponding to a piece of information of the second identifier closest to information of an event time of the log information is obtained based on the correspondence information, and information of the first identifier corresponding to the information of the event time is acquired.

* * * * *